United States Patent [19]

Umeno et al.

[11] Patent Number: 4,963,508
[45] Date of Patent: Oct. 16, 1990

[54] METHOD OF MAKING AN EPITAXIAL GALLIUM ARSENIDE SEMICONDUCTOR WAFER USING A STRAINED LAYER SUPERLATTICE

[75] Inventors: Masayoshi Umeno; Shiro Sakai, both of Nagoya; Shinichiro Yahagi, Ohbu, all of Japan

[73] Assignees: Daido Tokushuko Kabushiki Kaisha; Nagoya Institute of Technology, both of Nagoya, Japan

[21] Appl. No.: 483,364

[22] Filed: Feb. 22, 1990

Related U.S. Application Data

[60] Division of Ser. No. 325,115, Mar. 20, 1989, Pat. No. 4,928,154, and a continuation of Ser. No. 903,195, Sep. 3, 1986, abandoned.

[30] Foreign Application Priority Data

Sep. 3, 1985 [JP] Japan ................... 60-195628
Sep. 3, 1985 [JP] Japan ................... 60-195629
Sep. 3, 1985 [JP] Japan ................... 60-195630
Sep. 4, 1985 [JP] Japan ................... 60-195435

[51] Int. Cl.$^5$ .......................................... H01L 21/20
[52] U.S. Cl. ..................... 437/132; 148/DIG. 72; 148/DIG. 97; 148/DIG. 160; 156/610; 437/110; 437/111; 437/976
[58] Field of Search ............... 148/DIG. 25, 56, 65, 148/72, 97, 110, 160, 169, 149, 33, 33.1, 33.4, 33.5; 156/610-613; 357/16, 17; 427/248.1, 252, 255.1; 437/81, 105, 107, 126, 132, 108, 110, 111, 133, 976

[56] References Cited

U.S. PATENT DOCUMENTS

| | | | |
|---|---|---|---|
| 4,088,515 | 5/1978 | Blakesbe et al. ........... | 357/4 SL |
| 4,120,706 | 10/1978 | Mason ......................... | 437/132 |
| 4,558,336 | 12/1985 | Chang et al. .................. | 357/4 SL |
| 4,561,916 | 12/1985 | Akiyama et al. . | |
| 4,632,712 | 12/1986 | Fan et al. ..................... | 357/60 |
| 4,675,709 | 6/1987 | Scifres et al. ................. | 357/17 |
| 4,774,205 | 9/1988 | Choi et al. .................... | 437/132 |
| 4,826,784 | 5/1989 | Salerno et al. ................ | 437/132 |
| 4,835,116 | 5/1989 | Lee et al. ..................... | 437/132 |

FOREIGN PATENT DOCUMENTS

| | | | |
|---|---|---|---|
| 0073499 | of 1984 | Japan ........................ | 437/132 |
| 0145820 | 7/1986 | Japan ........................ | 437/132 |
| 0001224 | 1/1987 | Japan ........................ | 437/132 |

OTHER PUBLICATIONS

Kemlage, "Deposition of GaP Heteroepitaxy on Silicon", IBM TDB, vol. 18, No. 6, Nov. 1975, p. 1852.
Fischer et al., "Characteristics . . . (100) Silicon", Elec-
(List continued on next page.)

*Primary Examiner*—Olik Chaudhuri
*Assistant Examiner*—William Bunch
*Attorney, Agent, or Firm*—Oblon, Spivak, McClelland, Maier & Neustadt

[57] ABSTRACT

A semiconductor wafer having an epitaxial GaAs layer, including a monocrystalline Si substrate having a major surface which is inclined at an off angle between 0.5° and 5° with respect to (100); and at least one intermediate layer epitaxially grown on the major surface of the monocrystalline Si substrate, as a buffer layer for accommodating a lattice mismatch between the Si substrate and the epitaxial GaAs layer which is epitaxially grown on a major surface of the top layer of the at least one intermediate layer. The at least one intermediate layer may comprise one or mor GaP/GaAsP, GaAsP-/GaAs superlattice layers. the wafer may be used to produce a seimconductor light emitting element which has a plurality of crystalline gaAs layers including a light emitting layer epitaxially grown on the GaAs layer on the intermediate layer. The wafer may also be used to produce a compound semiconductor device such as amplifying and switching elements, light emitting and receiving elements and photovolataic elements. Methods for producing the semiconductor wafer, light emitting element and compound semiconductor devices are also disclosed.

3 Claims, 7 Drawing Sheets

OTHER PUBLICATIONS tron. Lett., vol. 20, No. 22, 25 Oct. 1984, pp. 945-947.

Metze et al., "Metal-Semiconductor . . . Epitaxy", Appl. Phys. Lett., vol. 45, No. 10, 15 Nov. 1984, pp. 1107-1109.

Tischler et al., "Defect Reduction . . . Superlattice", Appl. Phys. Lett., vol. 46, No. 3, Feb. 1985, pp. 294-296.

Osbourn et al., "A $GaAs_xP_{1-x}$/GaP Strained-Layer Supterlattice", Appl. Phys. Lett., vol. 41 No. 2, 15 Jul. 1982, pp. 172-174.

Kim et al., "Electronic Structure of GaP-AlP(100) Superlattices", J. Vac. Sci. Tech. vol. 21, No. 2, Jul.-/Aug. 1982, pp. 528-530.

Fan et al., "Heteroepitaxy on Silicon II", Mat. Res. Soc. Symp. Proc., vol. 91, 1987, pp. 99-103.

METHOD OF MAKING AN EPITAXIAL GALLIUM ARSENIDE SEMICONDUCTOR WAFER USING A STRAINED LAYER SUPERLATTICE

This is a divisional application of application Ser. No. 07/325,115 filed Mar. 20, 1989 U.S. Pat. No. 4,928,154, which in turn is a continuation of application Ser. No. 06/903,195 filed Sept. 3,1986,

BACKGROUND OF THE INVENTION

1. Field of the Invention

The present invention relates to semiconductor wafers having an epitaxially grown gallium arsenide layer, useful for fabricating various GaAs compound semiconducting devices, and methods suitable for producing such semiconductor wafers and devices.

2. Discussion of the Related Art

Group III-V compound semiconductors with a gallium arsenide (GaAs) layer have high carrier mobility, direct-gap band structure, and variable nature of band gap and lattice parameter or constant in the case of the compounds consisting of three or four elements. Owing to these characteristics, the Group III-V compound semiconductors have been enjoying expanding industrial applications for fabricating not only a variety of semiconductor elements such as high-speed transistors, laser diodes, light emitting diodes (LED), phototransistors, photodiodes and solar cells, but also integrated circuits incorporating these semiconductor elements. An active layer providing such an active element is formed in a monocrystalline substrate of gallium arsenide, by preferential diffusion or ion implantation technique, or alternatively as an epitaxial GaAs layer formed by epitaxy on the GaAs substrate crystal.

However, a monocrystalline gallium arsenide (GaAs) substrate suffers from some disadvantages over a monocrystalline silicon (Si) substrate, e.g., more difficulty in obtaining an ingot of a relatively large diameter, higher cost of production, and lower mechanical strength. In the light of these disadvatages of the monocrystalline gallium arsenide substrate, there has been an attempt to use a monocrystalline substrate of silicon, since the technologies for producing and processing its ingot are most advanced in the field of semiconductor materials. In this case, an active layer of gallium arsenide is epitaxially grown or formed by epitaxy on the surface of the nonocrystalline silicon substrate. However, the thus .obtained semiconductor wafer tends to have a lattice mismatch or dislocation of the epitaxial gallium arsenide active layer and the silicon substrate, and is not satisfactory in crystallinity of the active layer.

SUMMARY OF THE INVENTION

It is therefore a primary object of the present invention to provide a semiconductor wafer having a gallium arsenide layer of excellent crystallinity formed by epitaxy on a monocrystalline silicon substrate, suitable for economical, efficient large-scale production of gallium arsenide semiconductor elements or devices including newly developed optical IC arrangements.

In an effort to obtain an improved semiconductor wafer with a gallium arsenide layer epitaxially grown on a major surface of a monocrystalline silicon substrate, the present inventors have conducted extensive studies and investigations on an intermediate buffer layer to be interposed between the silicon substrate and the epitaxial gallium arsenide layer for orientation accommodating a lattice mismatch therebetween, and on an off angle at which the major surface of the silicon substrate is inclined with respect to a given plane (100) of the crystal.

The studies and investigations revealed that the crystallinity of an epitaxially grown gallium arsenide layer was enhanced if the major surface of the monocrystalline silicon substrate was inclined or oriented to (100) at an angle within a selected optimum range. Further, it was found that the crystallinity of the gallium arsenide layer was improved with selected materials of the intermediate layer, or where the intermediate layer includes a superlattice or superlattices of a selected combination or combinations of materials.

The inventors' found an improvement in the crystallinity of the epitaxial gallium arsenide layer when the intermediate buffer layer consists of a plurality of layers including a layer of gallium phosphide (GaP), a gallium phosphide/gallium arsenide-phosphide (Gap/GaAsP) superlattice layer, and a gallium arsenide-phosphide/gallium arsenide (GaAsP/GaAs) superlattice, such that the Gap layer and the GaP/GaAsP and GaAsP/GaAs superlattice layers are superposed on each other in the order as described seen in the direction from the major surface of the silicon substrate. The inventors also recognized a further improvement in the crystallinity of the epitaxial gallium arsenide layer where the orientation off angle of the major surface of the silicon substrate relative to (100) is held within a given range.

According to the invention, there is provided a semiconductor wafer having an epitaxial GaAs layer, comprising a monocrystalline substrate having a major surface which is inclined at an off angle between 0.5° and 5° with respect to (100), and at least one intermediate layer epitaxially grown on the major surface of the monocrystalline silicon substrate, as a buffer layer for accommodating or adjusting a lattice mismatch or dislocation between the silicon substrate and the epitaxial GaAs layer which is epitaxially grown on a major surface of a top layer of the at least one intermediate layer. The present semiconductor wafer with the epitaxial GaAs layer is suitably produced by a method according to the invention, which comprises a step of preparing a monocrystalline silicon substrate having a major surface inclined at an off angle between 0.5° and 5° with respect to (100), a step of forming at least one intermediate layer by epitaxy on the major surface of the monocrystalline silicon substrate, as a buffer layer for accommodating a lattice mismatch between the silicon substrate and the epitaxial GaAs layer, and a step of forming this epitaxial GaAs layer on a major surface of a top layer of the at least one intermediate layer.

The crystallinity of the epitaxial gallium arsenide (GaAs) layer formed on the silicon (Si) substrate was evaluated by measuring the surface roughness of the GaAs layer by a contact-type surface roughness tester, and the value (meV) of photoluminescence full-width at half maximum. The specified optimum range (0.5 to 5 degrees) of the off angle of the Si substrate permits the epitaxial GaAs layer according of the invention to have a higher degree of ,crystallinity, and a smaller value of photoluminescence than those of a GaAs layer grown on the Si substrate of (100) orientation (commonly used as a major surface in which the GaAs layer is formed). The off angle range is preferably between 1° and 3°, and more preferably in the neighborhood of 2°.

According to the invention, the epitaxially grown gallium arsenide layer is given an enhanced level of crystallinity, due the selected off angle range between 0.5° and 5° of the Si substrate to (100), and to the provision of at least one intermediate buffer layer which is formed by epitaxy on the major surface of the Si substrate, and on which the gallium arsenide layer is formed by epitaxy Accordingly, the present invention permits economical large-scale production of semiconductor wafers using a silicon substrate and a gallium arsenide active layer, which are suitable for fabricating various high-performance semiconductor elements, integrated circuits, and semiconductor, such as optical integrated circuit, and other hybrid integrated circuits which are combinations of conventional silicon ICs and Group III—V compound gallium arsenide semiconductor ICs.

According to one advantageous feature of the present invention, the at least one intermediate layer consists of a gallium phosphide (GaP) layer. Alternatively, the at least one intermediate layer may include at least one.

According to another advantageous feature of the invention, the at least one intermediate layer consists of a GaP/GaAsP superlattice formed on the Si substrate, and GaAsP/GaAs superlattice which is formed on the GaP/GaAsP superlattice layer and on which the epitaxial GaAs layer is formed. According to a further advantageous feature of the invention, there is formed a GaP layer, or there are formed an aluminum phosphide (AlP) layer and an aluminum-gallium phosphide (AlGaP) layer, between the Si substrate and the above-indicated GaP/GaAsP superlattice.

According to another aspect of the invention, there is provided a semiconductor wafer having an epitaxial GaAs layer, comprising a monocrystalline Si substrate, and at least one intermediate layer epitaxially grown on a major surface of the monocrystalline Si substrate, as a buffer layer for accommodating a lattice mismatch between the Si substrate and the epitaxial GaAs layer. The at least one intermediate layer consists of: a GaP layer formed on the Si substrate; a GaP/GaAsP superlattice. formed on the GaP layer; and a GaAsP/GaAs superlattice formed on the GaP/GaAsP superlattice layer. The epitaxial GaAs layer is formed on the a GaAsP/GaAs superlattice.

The semiconductor wafer described above is suitably produced by a method according to the invention, which comprises a step of preparing a monocrystalline Si substrate, a step of forming a first GaP layer by epitaxy on a major surface of the monocrystalline Si substrate, a step of forming a GaP/GaAsP superlattice by epitaxy on the GaP layer, a step of forming GaAsP/GaAs superlattice by epitaxy on the a GaP/GaAsP superlattice, and a step of forming a GaAs layer by epitaxy on the GaAsP/GaAs superlattice.

In the semiconductor wafer of the invention described above, which is produced by the method of the invention described just above, the second GaAs layer is formed on the intermediate buffer layers which consist of the GaP layer, the GaP/GaAsP and GaAsP/GaAs superlattices all of these intermediate layers being superposed on each other in the order as described as seen in the direction from the major surface of the Si substrate. The provision of these intermediate layers contribute to improved crystallinity of the epitaxial GaAs layer formed on top of the intermediate layers. Therefore, like the semiconductor wafer of the invention previously described, the instant semiconductor wafer using a silicon substrate and an epitaxial gallium arsenide active layer is suitably applied to the fabrication of various high-quality semiconductor elements, integrated circuits, and optical integrated circuits and other hybrid integrated circuits which are combinations of conventional silicon ICs and Group III–V compound gallium arsenide ICs. For example, the instant semiconductor wafer is used for bi-polar transistors, field effect transistors, light emitting diodes, laser diodes, light receiving elements, solar cells, and other semiconductor elements, and is further used for integrated circuits incorporating such semiconductor elements in combination.

All of the above-described superlattices have a lattice constant between the lattice constants of the Si substrate and the GaAs layer.

BRIEF DESCRIPTION OF THE DRAWINGS

The foregoing and other objects, features and advantages of the present invention will be better understood by reading the following description of examples of the invention, when considered in connection with the accompanying drawings, in which.

DESCRIPTION OF THE PREFERRED EMBODIMENTS

The following examples are given for illustrative purpose only, to further clarify the principle of the present invention, referring to the accompanying drawings.

EXAMPLE 1

Figure 1:
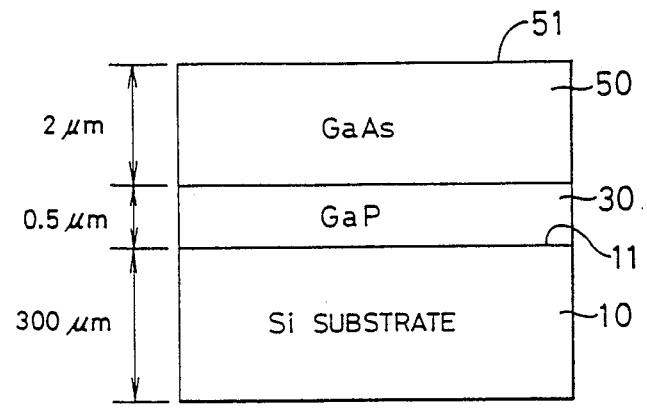
FIG. 1 is a cross sectional view of a semiconductor wafer embodying the principle of the present invention.

Referring first to FIG. 1, there is shown in cross section one embodiment of a semiconductor wafer of the present invention. In the figure, reference numeral 10 designates an n-type monocrystalline silicon (Si) substrate. On this Si substrate are formed an intermediate gallium phosphide (GaP) layer 30 and an epitaxial gallium arsenide (GaAs) layer 50. The monocrystalline Si substrate 10 has a thickness of 300 microns. The GaP layer 30 is 0.5 micron thick, while the GaAs layer 50 is 2 microns thick. The GaP and GaAs layers 30, 50 were formed continuously by epitaxy on the Si substrate, in a metalorganic chemical vapor deposition process (MOCVD), in a reaction furnace in the form of a horizontal induction-heating furnace under the atmospheric pressure. As the materials for the GaP and GaAs layers 30, 50, trimethylgallium (TMGa, Ga(CH$_3$)$_3$), arsine (AsH$_3$) and phosphine (PH$_3$) were used. The flow rates of these gases were controlled accurately by a flow control device so that the epitaxial growth of the GaP and GaAs layers may occur at a suitable rate. No precracking of the Group V elements was effected Prior to starting the epitaxy, the Si substrate 10 was first annealed at 1000° C. in hydrogen for ten minutes, to remove an oxide layer from its surface Subsequently, the Si substrate 10 was maintained at 900° C. to permit an epitaxial growth of GaP into the intermediate GaP layer 30, and thereafter maintained at 650° C. to allow an epitaxial growth of GaAs into the GaAs layer 50.

In the above-described manner, a number of semiconductor wafers were prepared, with different off angles to (100) of the major surface 11 of their Si substrates 10.

Figure 2:
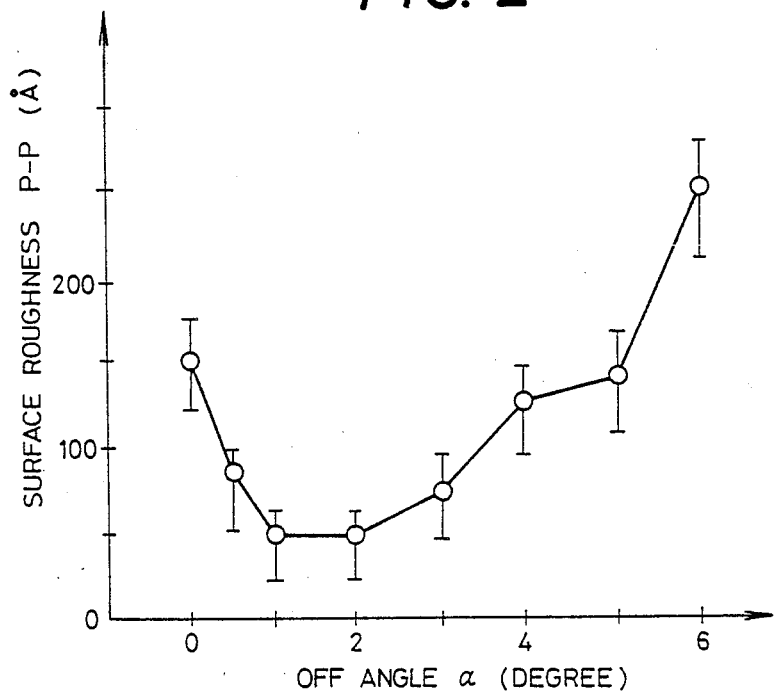
FIG. 2 is a graphical representation of measurements indicating the surface roughness of an epitaxial GaAs layer of the wafer versus the off angle of a Si substrate of the wafer.

The roughness of an exposed surface 51 of the epitaxial GaAs layer 50 of each wafer was measured by a contact type surface roughness tester. The measurements of the individual wafers are shown in FIG. 2, wherein the off angle $\alpha$ (degree) of the major surface 11 of the Si substrate 10 to (100) is taken along the abscissa, while the peak-to-peak roughness (Angstrom) of the surface 51 of the GaAs layer 50 is taken along the ordinate. As is apparent from the graph in FIG. 2, the smoothness of the surface 51 of the wafers with the substrate off angle within a range between 0.5° to 5° is improved over that with the substrate off angle of 0°. The best result is obtained with the off angle range from 1° to 2°, within which the roughness of the surface 51 is less than 50 Angstroms, more than three times as small as 150 Angstroms in the case of the off angle of 0°.

EXAMPLE 2

Figure 3:
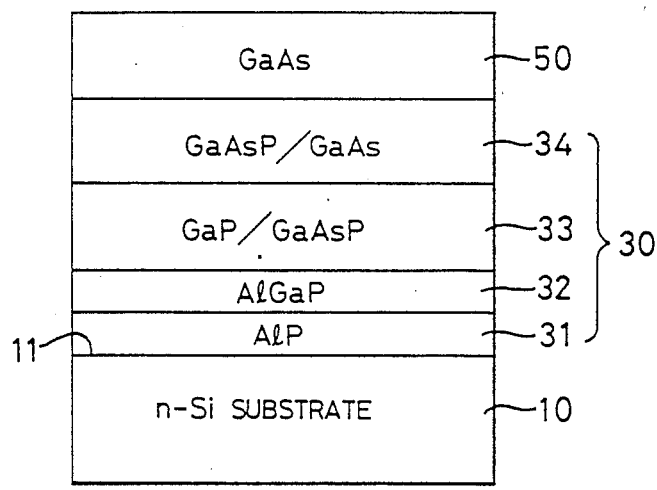
FIG. 3 is a cross sectional view of another embodiment of a semiconductor wafer of the invention.

Referring next to FIG. 3, there is shown in cross section another example of a semiconductor wafer according to the invention, wherein reference numeral 10 designates an n-type monocrystalline Si substrate on which a plurality of intermediate layers 30 are formed, so as to accommodate a lattice mismatch between the Si substrate 10 and an epitaxial GaAs layer 50 formed on the intermediate layers 30. This Example 2 is different from Example 1 in that the four intermediate layers 30 are used in Example 2, in place of the single intermediate GaP layer 30 used in Example 1. Described more specifically, the intermediate layers 30 of Example 2 consist of: a first intermediate layer in the form of an aluminum phosphide (AlP) layer 31 which is easily epitaxially grown on the Si substrate 10, with a high degree of adherence thereto; a second intermediate layer in the form of an aluminum gallium phosphide (Al$_{0.5}$Ga$_{0.5}$P) layer 32 formed on the first intermediate AlP layer 31; a third intermediate layer in the form of ten superlattice layers 33 of gallium phosphide (GaP) and gallium arsenide-phosphide (GaAs$_{0.5}$P$_{0.5}$), formed on the second intermediate Al$_{0.5}$Ga$_{0.5}$P layer 32; and a fourth intermediate layer in the form of ten layers 34 of gallium arsenidephasphide arsenide (GaAs$_{0.5}$P$_{0.5}$) and gallium arsenide (GaAs), formed on the third intermediate GaP/GaAs$_{0.5}$P$_{0.5}$ superlattice 33. The Si substrate 10 is 300 microns thick, and the epitaxial GaP layer 50 is 2 microns thick. The four intermediate layers 30 have a total thickness of 0.42 micron. Each of the first and second intermediate layers 31, 32 is 100 Angstroms thick. Each of the ten third intermediate GaP/GaAs$_{0.5}$P$_{0.5}$ superlattice layers 33, and each of the ten fourth intermediate GaAs$_{0.5}$P$_{0.5}$/GaAs superlattice layers 34 have a thickness of 200 Angstroms.

As in Example 1, a metalorganic chemical vapor deposition process (MOCVD) was employed to form the intermediate layers 30 and the GaAs layer 50. In addition to the materials used in Example 1, trimethylaluminum (TMAl.Al(CH$_3$)$_3$) was used. The temperature during the epitaxial growth of the first through fourth intermediate layers 31–34 was 830° C., and the temperature during the epitaxial growth of the GaAs layer 50 was 730° C. The other conditions were the same as in Example 1.

In the above-indicated manner, a number of semiconductor wafers were prepared, with different off angles to (100) of the major surface 11 of their Si substrates 10.

Figure 4:
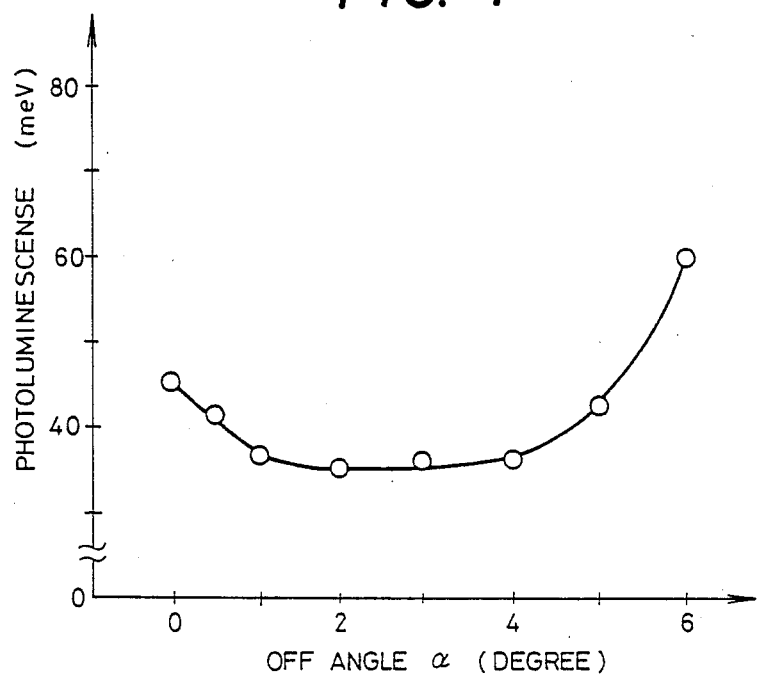
FIG. 4 is a graphical representation of measurements indicating the value (meV) of photoluminescence full-width at half maximum of an epitaxial GaAs layer of the wafer of FIG. 3 versus the off angle of a Si substrate of the wafer.

The photoluminescense full-width at half maximum (meV) was measured for each wafer prepared. The measurements of the individual wafers are shown in FIG. 4. As indicated in the figure, the meV value is lower with the substrate off angle within a range between 0.5° to 5°, than that with the substrate off angle of 0°. This means improved crystallinity of the epitaxial GaAs layer 50 of the present wafers. Comparatively good results were obtained with the Si substrates 10 having an off angle within a range from 1° to 4°, and the best results were obtained with the Si substrate 10 with an off angle in the neighborhood of 2°.

EXAMPLE 3

Semiconductor wafers were prepared according to Example 2 of FIG. 3, but without the first and second intermediate layers 31 and 32. Photoluminescense tests conducted on these wafers showed substantially the same results as in Example 2. That is, the tests revealed improvement in the crystallinity of the epitaxial GaAs layer 50 where the off angle of the Si substrate 10 is within the range between 0.5° and 5°.

EXAMPLE 4

In Example 4, the first and second intermediate layers 31 and 32 of the wafer of FIG. 3 were replaced by a single GaP layer having a thickness of 0.5 micron. Photoluminescense tests showed similar results, i.e., improved crystallinity of the GaAs layer 50 on the wafers whose Si substrates 50 have an off angle between 0.5° and 5°.

EXAMPLE 5

This example was given to demonstrate that the crystallinity of the epitaxial GaAs layer 50 may be improved according to the invention, even with the off angle of the Si substrate 10 is 0°.

Figure 5:
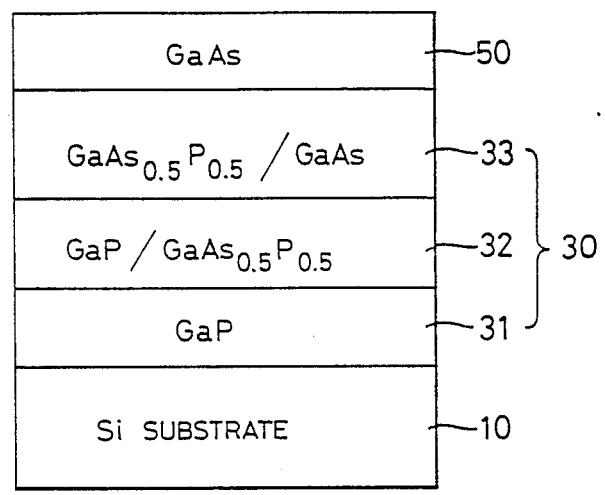
FIG. 5 is a cross sectional view of a further embodiment of a semiconductor wafer of the invention.

A wafer prepared according to Example 5 is depicted in FIG. 5. The wafer includes a plurality of intermediate layers 30 to accommodate a lattice mismatch between an n-type monocrystalline (100)-oriented Si substrate 10 (with an off angle of 0°) and an epitaxial GaAs layer 50. The intermediate layers 30 consist of: a first intermediate layer in the form of a GaP layer formed on the Si substrate 10; a second intermediate layer in the form of ten superlattice layers 32 of gallium phosphide (GaP) and gallium arsenide-phosphide (GaAs$_{0.5}$P$_{0.5}$), formed on the GaP layer 31; and a third intermediate layer in the form of ten superlattice layers 33 of gallium arsenidephosphide (GaAs$_{0.5}$P$_{0.5}$) and gallium arsenide (GaAs), formed on the second intermediate GaP/GaAs$_{0.5}$P$_{0.5}$ superlattice layer 32. The Si substrate 10 is 300 microns thick, and the epitaxial GaP layer 50 is 2 microns thick. The three intermediate layers 30 (31, 32, 33) have a total thickness of 0.9 micron. The first intermediate layer 31 is 0.5 micron thick. Each of the ten second intermediate GaP/GaAs$_{0.5}$P$_{0.5}$ superlattice layers 32, and each of the ten third intermediate GaAs$_{0.5}$P$_{0.5}$/GaAs superlattice layers 33 have a thickness of 200 Angstroms.

The intermediate layers 30 and the epitaxial GaAs layers were formed continuously by epitaxy on the Si substrate 10, in a metalorganic chemical vapor deposition process (MOCVD), within a horizontal induction-heating furnace under the atmospheric pressure. As the materials for the vapor deposition, trimethylgallium (TMGa, Ga(CH$_3$)$_3$), arsine (AsH$_3$) and phosphine (PH$_3$) were employed. The overall flow rate of these gases was 2.5 liters/min., and the flow rate of each individual gas was controlled accurately by a flow control device so as to achieve an epitaxial growth rate of 0.1 micron/min. No pre-cracking of the Group V elements was effected. Prior to starting the epitaxy, the Si substrate 10 was first annealed at 950° C. with a flow of PH$_3$ at 100cc/min. Thereafter, the Si substrate 10 was maintained at 900° C. to permit an epitaxial growth of GaP into the first intermediate GaP layer 31, and then at 830° C. to allow epitaxial growth of the second and third intermediate superlattices layers 32, 33. Subsequently, the epitaxial growth temperature was lowered down to 650° C., to grow the GaAs layer 50 on the GaAs$_{0.5}$P$_{0.5}$/GaAs superlattice 33. The annealing temperature of the Si substrate 10 may be selected within a range from 600° C. to 1100° C., and the annealing period during which the Si substrate 10 is exposed to PH$_3$ may be selected within a range from 1 to 60 minutes.

In the above-described manner, the semiconductor wafer of FIG. 5 (Sample No. 1) was prepared, and its photoluminescense characteristic was compared with those of Comparative Samples Nos. 2–4. The measured photoluminescense full-width at half maximum (meV) at 150° K are indicated in the following table.

| Samples | Composition | PL Full-width at half maximum (meV) |
|---|---|---|
| No. 1 (Example 5) | GaAs/(GaAsP/GaAs)/ (GaP/GaAsP)/GaP/Si | 45 |
| No. 2 | GaAs/(GaAsP/GaAs)/ (GaP/GaAsP)/Si | 52 |
| No. 3 | GaAs/Ge/Si | 62 |
| No. 4 | GaAs/GaAs | 33 |

It will be understood from the above table that Comparative Sample No. 3 using a single intermediate layer of Ge had the largest measurement of 62 meV, and that the second largest measurement (52 meV) was obtained on Comparative Sample No. 2 which uses GaP/GaAs$_{0.5}$P$_{0.5}$ superlattice layers and GaAs$_{0.5}$P$_{0.5}$ superlattice layers. Sample No. 1 of the present Example 5 had a value of 45 meV. This value is considered to indicate a relatively high degree of crystallinity of the GaAs layer 50 of Sample No. 1, in view of the fact that Comparative Sample No. 4 which uses a GaAs substrate for an epitaxial GaAs layer had a value of 33 meV.

EXAMPLE 6

Figure 6:
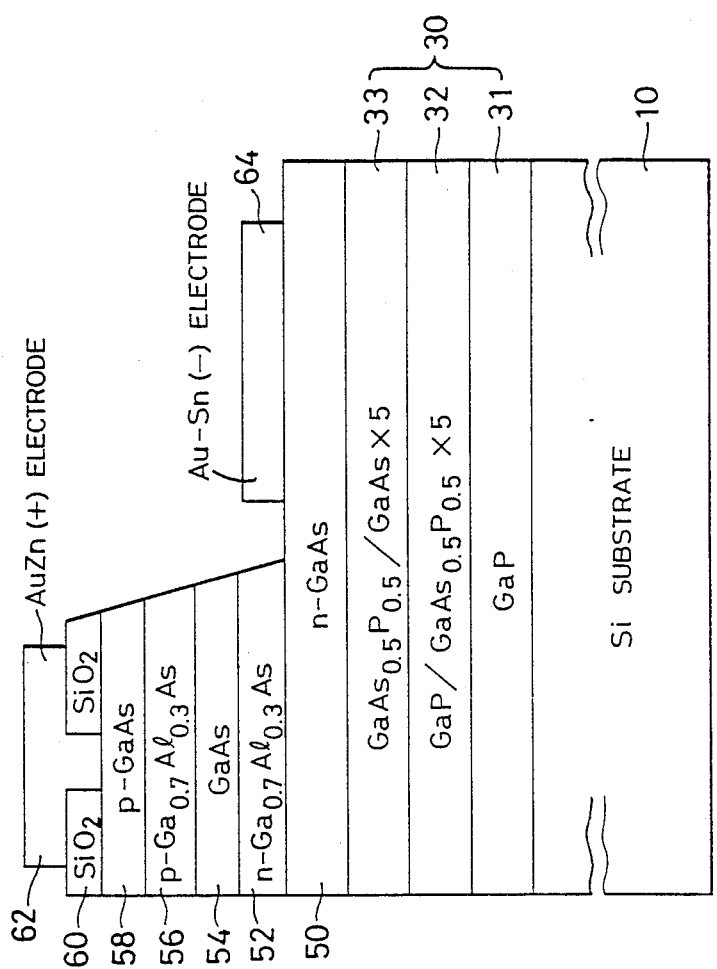
FIG. 6 is a cross sectional view of a still further embodiment of the invention in the form of a laser diode.

Referring next to FIG. 6, there is shown another embodiment of the present invention in the form of a semiconductor laser diode. In the figure, reference numeral 10 designates an n-type monocrystalline Si substrate having a major surface which is inclined at 2° with respect to the (100) orientation. Reference numeral 30 generally indicates a plurality of intermediate layers, while reference numeral 50 indicates an n-type epitaxially grown GaAs layer. On the epitaxial GaAs layer 50, the following layers are superposed on each other in the order of description: n-Ga$_{0.7}$Al$_{0.3}$As cladding layer 52; i-GaAs active layer 54; p-Ga$_{0.7}$Al$_{0.3}$As cladding layer 56; P-GaAa cap layer 58; SiO$_2$ insulating layer 60; and Au-Zn electrode 62 (anode). An Au-Sn electrode 64 (cathode) is also formed on the epitaxial n-GaAs layer 50. The thicknesses of the layers 10, 30, 50, 52, 54, 56 and 58 are as follows:

| | |
|---|---|
| Si substrate 10: | 300 microns |
| Intermediate layers 30: | 0.25 micron (total) |
| GaAs layer 50: | 2 microns |
| Cladding layer 52: | 1.5 microns |
| Active layer 54: | 0.1 micron |
| Cladding layer 56; | 1.5 microns |
| Cap layer 58: | 0.5 micron |

The intermediate layers 30 consist of: a first intermediate layer in the form of a single GaP layer 31 formed on the Si substrate 10; a second intermediate layer in the form of five Gap/GaAs$_{0.5}$P$_{0.5}$ superlattice layers 32 formed on the GaP layer 31; and a third intermediate layer in the form of five GaAs$_{0.5}$P$_{0.5}$/GaAs superlattice layers 33 formed on the second intermediate layer 32. The first intermediate GaP layer 31 has a thickness of 500 Angstroms, and each superlattice layer of the second and third intermediate layers 32, 33 has a thickness of 200 Angstroms.

The layers 30, 50, 52, 54, 56 and 58 were formed continuously on each other by epitaxy on the Si substrate 10, in a metalorganic chemical vapor deposition process (MOCVD), in a horizontal induction-heating furnace under atmospheric pressure. As the materials for the vapor deposition, trimethylgallium (TMGa, Ga(CH$_3$)$_3$), trimethylaluminum (TMAl.Al(CH$_3$)$_3$), arsine (AsH$_3$) and phosphine (PH$_3$) were employed. As p-type and n-type dopants, diethylzinc (DEZn) and hydrogen selenide (H$_2$Se) were used. The flow rates of these gases were controlled accurately by a flow control device so as to achieve a suitable rate of epitaxial growth of crystals. No pre-cracking of the Group V elements was effected. Prior to starting the epitaxy, the Si substrate 10 was first annealed at 950° C. with a flow of PH$_3$ at 100cc/min., to remove the oxide layer from its surface. Thereafter, the Si substrate 10 was maintained at 900° C. to permit an epitaxial growth of a GaP crystal into the first intermediate GaP layer 31, and then at 700° C. to allow epitaxial growth of the second and third intermediate superlattices 32, 33. The epitaxial growth temperature of 700° was further maintained to grow the n-GaAs layer, n-Ga$_{0.7}$Al$_{0.3}$As cladding layer 52, GaAs active layer 54, p-Ga$_{0.7}$Al$_{0.3}$As cladding layer 56 and p-GaAs cap layer 58. Subsequently, the surface of the p-GaAs cap layer 58 was coated with a photoresist or light-sensitive coating. A selected area of the applied photoresist coating was covered with a mask, and the non-covered area of the photoresist coating was exposed to light, to provide a mask for a subsequent etching process. The portions of the layers 52, 54, 56, 58 corresponding to the exposed area of the photoresist were removed in the etching process, whereby a portion of the surface of the n-GaAs layer 50 was exposed, as shown in FIG. 6. Then, SiO$_2$ was applied to the surface of the p-GaAs cap layer 58, to form the SiO$_2$ insulating layer 60. A recess was formed in the insulating layer 60 in a known photolithographic manner, and the Au-Zn electrode 62 (anode) was formed by vapor deposition on the insulating layer 60. Similarly, the Au-Zn electrode 64 (cathode) was formed by vapor deposition and diffusion on the exposed surface of the n-GaAs layer 50. The thus prepared multilayered structure was cut into a plurality of laser diodes, such that each diode had a laser emitting face.

Figure 7:
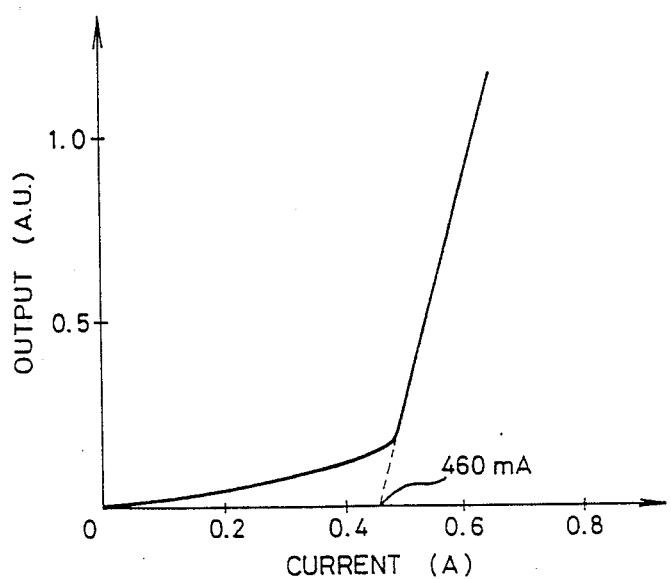
FIG. 7 is a graph showing an input-output characteristic curve of the laser diode of FIG. 6.
Figure 8:
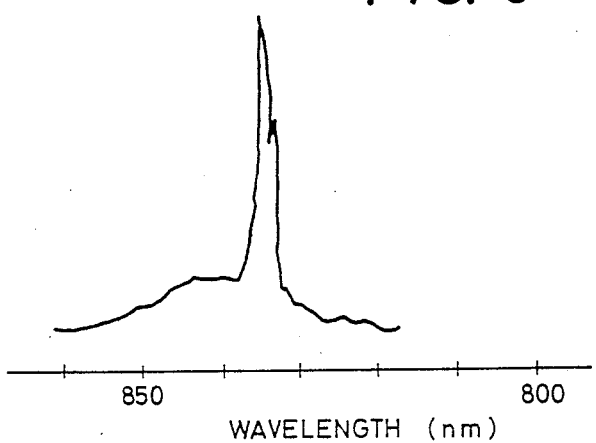
FIG. 8 is a graph showing a spectrum of a laser beam produced by the laser diode.

The laser diodes were activated to produce a lasing action. The input-output characteristic curve is shown in FIG. 7. The threshold value of current was 460 mA. The spectrum of the emitted light is given in FIG. 8.

EXAMPLE 7

Figure 9:
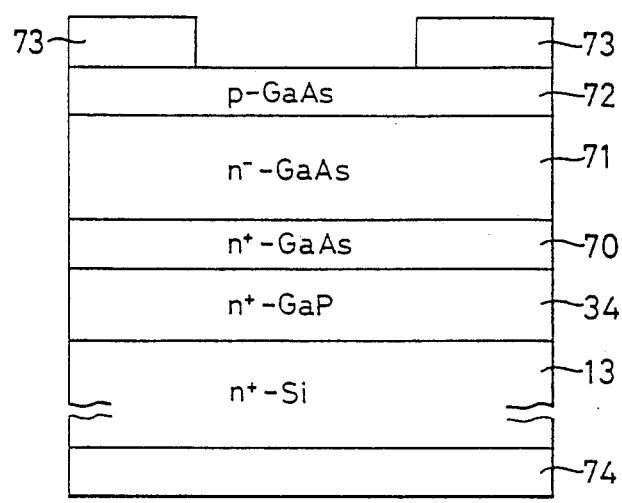
FIG. 9 is a cross sectional view of yet another embodiment of the invention in the form of a photodiode.
Figure 10:
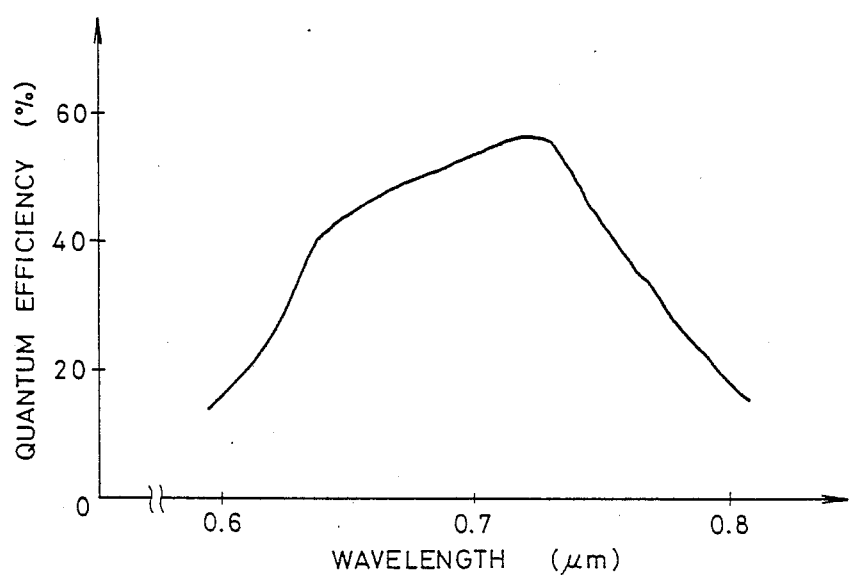
FIG. 10 is a graph showing the quantum efficiency versus wavelength of a light beam emitted by the photodiode of FIG. 9.

Referring further to FIG. 9, there is shown a further embodiment of the present invention in the form of a photodiode. In the figure, reference numeral 13 indicates an n-type monocrystalline Si substrate having a major surface which is inclined at 2° with respect to (100). On this Si substrate 13, there are formed an intermediate n+ GaP layer 34, an epitaxial n+ GaAs layer 70, an epitaxial n− GaAs layer 71, and an epitaxial p- GaAs layer 72. A Au-Zn electrode 73 and a Au-Sn electrode 74 are formed on the top surface of the p-GaAs layer 72 and the bottom surface of the Si substrate 13, respectively. The layers 70, 71 and 72 constitute a PIN diode. The Si substrate 13 which has an initial thickness of 300 microns, was ground to 50 microns after the layers 34, 70-72 had been formed thereon by epitaxy. Thicknesses of the epitaxially grown layers 34, 71, 72 and 73 are 1 micron, 0.5 micron, 2.5 microns and 0.5 micron, respectively. These layers were formed in an MOCVD process as practiced in the preceding Examples. The intermediate layer 34 was grown at 900° C., and the layers 71-73 were grown at 650° C. After these layers were formed by epitaxy, the electrodes 73, 74 were vapor deposited, and the prepared multilayered structure was cut into a plurality of photodiodes, such that each photodiode had a light receiving face. The quantum efficiency (emitted energy/incident energy) of the thus produced photodiodes, in relation to the wavelength, is shown in FIG. 10.

EXAMPLE 8

Figure 11:
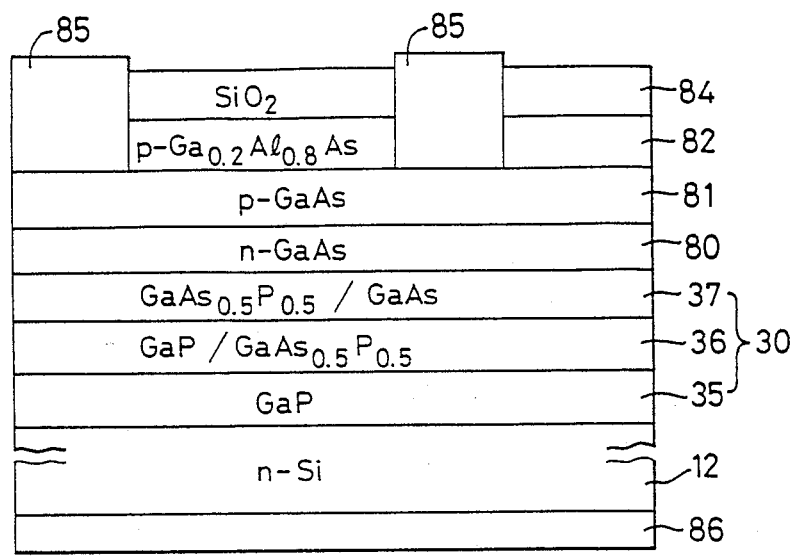
FIG. 11 is a cross sectional view of a further embodiment of the invention in the form of a solar cell.
Figure 12:
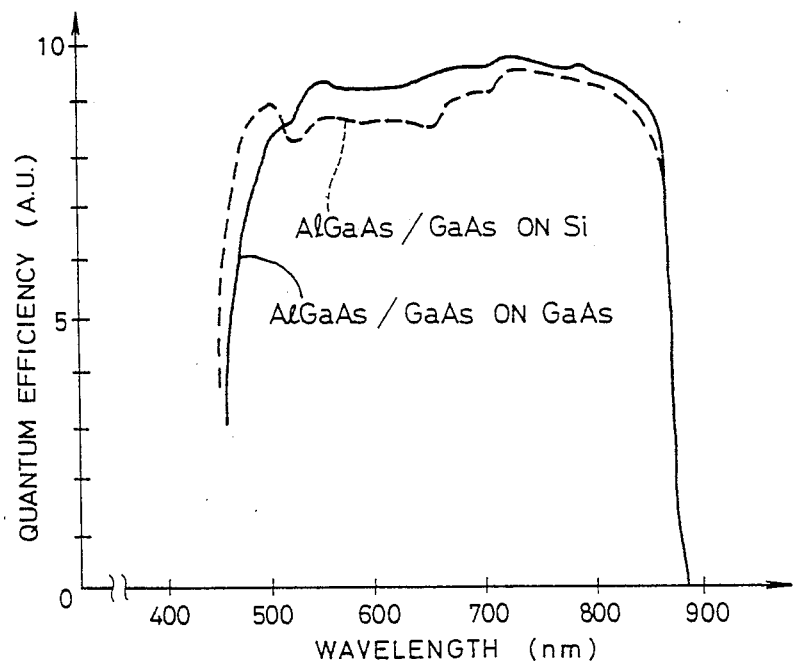
FIG. 12 is a graph showing spectral sensitivity curves of the solar cell of FIG. 11.

Referring next to FIG. 11, there is illustrated yet another embodiment of the invention in the form of a solar cell. In the figure, reference numeral 12 designates an n-type monocrystalline Si substrate having a major surface which is inclined at 2° to (100). On this Si substrate 12, there are epitaxially formed the following epitaxial layers: a first intermediate GaP layer 35; a second intermediate layer in the form of GaP/-GaAs$_{0.5}$P$_{0.5}$ superlattice layers 36; a third intermediate layer in the form of GaAs$_{0.5}$P$_{0.5}$/GaAs superlattice layers 37; an n-GaAs layer 80; a p-GaAs layer 81; and p-Ga$_{0.2}$Al$_{0.8}$As layer 82. Reference numeral 84 designates a non-reflection SiO$_2$ coating, and numerals 85 and 86 indicate Au-Zn and Al electrodes, respectively. The Si substrate 12 which has an initial thickness of 300 microns, was ground to 50 microns after the intermediate layers 35-37 and the layers 80-82, 84 had been epitaxially grown thereon. The first intermediate GaP layer 35 is 500 Angstroms thick. The thicknesses of the layers 80, 81, 82 and 84 are 0.5 micron, 0.5 micron, 0.1 micron and 80 nanometers, respectively. These epitaxial layers 35-37, 80-82 were formed in a metalorganic chemical vapor deposition process (MOCVD) as in the preceding Examples. The growth temperature was 900° C. for the intermediate layer 35, and 650° C. for the layers 80-82. After the layer 82 had been formed, SiO$_2$ was applied by sputtering to form the non-reflection coating 84 on the layer 82. By photolithography and etching techniques, recesses were formed in the selected areas of the coating 84 and the layer 82, in order to accommodate the Au-Zn electrodes 85 which were formed by vapor deposition. Then, the Si substrate 12 was ground to 50 microns as previously mentioned. The Al electrode 86 was subsequently formed by vapor deposition. The thus prepared solar cell using the silicon substrate 12 exhibited excellent spectral sensitivity as shown by the solid line in FIG. 12. The dashed line in the same figure represents a spectral sensitivity curve of a conventional solar cell using a GaAs substrate. The spectral sensitivity of the present Example 8 using the Si substrate 12 is comparable to that of the conventional cell using the GaAs substrate.

Although the gallium arsenide wafers employed for the semiconductor devices of Examples 6–8 use a silicon substrate whose major surface is inclined at 2° to (100), the off angle of the substrates of these examples may be zero. In this case, too, the GaAs layers are given a satisfactory level of crystallinity. Further, the semiconductor devices of Examples 6–8 may use the semiconductor wafers of Examples 2 and 3.

As another modification, the GaAs light emitting layer 54 of Example 6 may be replaced by a AlGaP layer.

While the present invention has been described in its preferred embodiments with a certain degree of particularity, it is to be understood that the invention is by no means limited thereto, but various changes, modifications and improvements may be made in the invention, in the light of the foregoing teachings, without departing from the spirit and scope of the invention defined in the appended claims.

What is claimed is:

1. A method of producing a semiconductor wafer having an epitaxial GaAs layer, comprising the steps of:

preparting a monocrystalline Si substrate having a major surface which is inclined at an off angle between 0.5° and 5° with respect to (100);

forming at least one intermediate layer by epitaxy on said major surface of said monocrystalline Si substrate, as a buffer layer for accommodating a lattice mismatch between said Si substrate and said GaAs layer;

said at least one intermediate layer consisting essentially of GaP layer formed on said Si substrate, a GaP/GaAsP superlattice formed on said GAP layer, and a GaAsP/GaAs superlattice on said GaP/GaAsP superlattice, wherein said GaP layer has a greater thickness than the total thickness of said superlattices; and said GaP/GaAsP superlattice and said GaAsP/GaAs superlattice having an average lattice constant between the lattice constant of said Si substrate and the lattice constant of said GaAs layer; and forming said epitaxial GaAs layer on said said GaP/GaAsP superlattice.

2. A method of producing a semiconductor wafer, comprising the steps of:

preparing a monocrystalline Si substrate;

forming a GaP layer by epitaxy on a major surface of said monocrystalline Si substrate;

forming at least one GaP/GaAsP superlattice layer by epitaxy on said GaP layer;

forming at least one GaAsP/GaAs superlattice layer by epitaxy on said at least one GaP/GaAsP superlattice layer; and forming a GaAs layer by epitaxy on said at least one GaAsP/GaAs superlattice layer, wherein said GaP layer has a greater thickness than the total thickness of said superlattices; and said GaP/GaAsP superlattice and said GaAsP/GaAs superlattice having an average lattice constant between the lattice constant of said Si substrate and the lattice constant of said GaAs layer.

3. A method according to claim 3, further comprising annealing said monocrystalline Si substrate by subjecting the Si substrate at a temperature between 600° C. and 1100° C., to a flow of $PH_3$ gas for a period ranging from 1 to 60 minutes.

* * * * *